US008367305B1

(12) United States Patent
Wojciechowski et al.

(10) Patent No.: US 8,367,305 B1
(45) Date of Patent: Feb. 5, 2013

(54) METHOD FOR FABRICATING A MICROELECTROMECHANICAL RESONATOR

(75) Inventors: Kenneth E. Wojciechowski, Albuquerque, NM (US); Roy H. Olsson, III, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 273 days.

(21) Appl. No.: 12/884,237

(22) Filed: Sep. 17, 2010

(51) Int. Cl.
*G03F 7/26* (2006.01)

(52) U.S. Cl. ........................................ 430/319

(58) Field of Classification Search ............ 430/311, 430/319, 313
See application file for complete search history.

(56) References Cited

U.S. PATENT DOCUMENTS

| | | | |
|---|---|---|---|
| 6,680,660 | B2 | 1/2004 | Nguyen |
| 7,194,247 | B2 | 3/2007 | Tikka et al. |
| 7,295,088 | B2 | 11/2007 | Nguyen et al. |
| 7,319,371 | B2 | 1/2008 | Ten Dolle et al. |
| 7,319,372 | B2 | 1/2008 | Pan et al. |
| 7,342,351 | B2 | 3/2008 | Kubo et al. |
| 7,492,241 | B2 | 2/2009 | Piazza et al. |
| 7,550,904 | B2 | 6/2009 | Kawakubo et al. |
| 2006/0290449 | A1 | 12/2006 | Piazza et al. |
| 2009/0237180 | A1 | 9/2009 | Yoshida |

OTHER PUBLICATIONS

John R. Clark, et al, Parallel-Resonator HF Micromechanical Bandpass Filters, Digest of Technical Papers, 1997, International Conference, Chicago, Illinois, Jun. 16-19, 1997, pp. 1161-1164.
Gianluca Piazza, et al, Single-Chip Multiple-Frequency ALN MEMS Filters Based on Contour-Mode Piezoelectric Resonators, Journal of Microelectromechanical Systems, vol. 16, No. 2, Apr. 2007, pp. 319-325.
Roy H. Olsson III, et al, Post-CMOS Compatible Aluminum Nitride MEMS Filters and Resonant Sensors, Proceedings of the 2007 IEEE International Frequency Control Symposium, pp. 412-419, 2007.
Gianluca Piazza, et al, One and Two Port Piezoelectric Higher Order Contour-Mode MEMS Resonators for Mechancial Signal Processing, Solid-State Electronics 51 (2007) 1596-1608.
Mustafa U. Demirci, et al, Single-Resonator Fourth-Order Micromechanical Disk Filters, 18th Int. IEEE Micro Electro Mechanical Systems Conf, Miami, Florida, Jan. 30-Feb. 3, 2005, pp. 207-210.

*Primary Examiner* — Kathleen Duda
*Assistant Examiner* — Caleen Sullivan
(74) *Attorney, Agent, or Firm* — Olivia J. Tsai

(57) ABSTRACT

A method is disclosed which calculates dimensions for a MEM resonator in terms of integer multiples of a grid width G for reticles used to fabricate the resonator, including an actual sub-width $L_a=NG$ and an effective electrode width $W_e=MG$ where N and M are integers which minimize a frequency error $f_e=f_d-f_a$ between a desired resonant frequency $f_d$ and an actual resonant frequency $f_a$. The method can also be used to calculate an overall width $W_o$ for the MEM resonator, and an effective electrode length $L_e$ which provides a desired motional impedance for the MEM resonator. The MEM resonator can then be fabricated using these values for $L_a$, $W_e$, $W_o$ and $L_e$. The method can also be applied to a number j of MEM resonators formed on a common substrate.

15 Claims, 6 Drawing Sheets

100

Calculate parameters for the MEM resonator for a desired resonant frequency $f_d$ including a sub-width $L = \lambda/2 = C_m/2f_d$ and an electrode width $W = \lambda/4 = C_m/4f_d$ where $\lambda$ is an acoustic wavelength and $C_m$ is a material speed for the MEM resonator. — 102

Calculate an actual resonant frequency $f_a = C_m/2L_a = C_m/2NG$ for which the MEM resonator can be fabricated using an actual sub-width $L_a = NG$ where G is a grid size for at least one photolithographic reticle to be used to fabricate the MEM resonator, and N is calculated from $N = C_m/2f_dG$ rounded to be an integer number for which $f_a$ is nearest to but above the desired resonant frequency $f_d$. — 104

Calculate the actual resonant frequency using $f_a = C_m(M,N)/2NG$ over at least a part of the range $N/2 \leq M < N$ where M is an integer and $C_m(M,N)$ accounts for changes in the material speed $C_m$ due to an effective electrode width $W_e = MG$, and select the value of M for which a frequency error $f_e = f_d - f_a = f_d - C_m(M,N)/2NG$ is a minimum. — 106

Fabricate the MEM resonator using the actual sub-width $L_a = NG$ and the effective electrode width $W_e = MG$. — 108

FIG. 2

Calculate a number $n_i$ of actual sub-widths $L_{ai} = N_iG$ which will fit into a maximum width $W_{mi}$ of each MEM resonator from $n_i = W_{mi}/L_{ai} = W_{mi}/N_iG$ with $n_i$ being rounded down to be an integer number. — 160

Calculate an effective electrode length $L_{ei}$ for each MEM resonator from $L_{ei} = N_i\rho/M_in_iR_{di}$ where $\rho$ is a resistivity per unit length of electrodes in the j MEM resonators, and $R_{di}$ is a desired motional impedance for each MEM resonator for $i = 1,...,j$, and with $L_{ei}$ then being rounded up or down to be an integer multiple of the grid size G. — 162

Fabricate each MEM resonator in step 158 with the effective electrode lengths $L_{ei}$ and with an overall width $W_{oi} = n_iL_{ai} = n_iN_iG$ for $i = 1,...,j$. — 164

FIG. 5

METHOD FOR FABRICATING A MICROELECTROMECHANICAL RESONATOR

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to microelectromechanical (MEM) resonators and, in particular, to a method for fabricating one or more MEM resonators which overcomes constraints due to a fixed grid size of reticles used in the fabrication process to provide an actual resonant frequency for each fabricated MEM resonator which is close to a desired resonant frequency for that MEM resonator.

BACKGROUND OF THE INVENTION

Microelectromechanical (MEM) resonators are useful to form oscillators and filters. Of particular interest are MEM resonators which utilize a layer of a piezoelectric material and operate in a contour mode. In such contour-mode MEM resonators, the piezoelectric material expands and contracts in a direction parallel to the layer in response to an applied voltage of oscillation, with the resonant frequency being generally determined by a lateral dimension (e.g. a width or length) of the MEM resonator. Since the resonant frequency does not depend upon a thickness of the layer of piezoelectric material, but instead depends on its width or length, then a plurality of MEM resonators having different resonant frequencies can be fabricated on a common substrate and used, for example, as a channel-selection filter. A particular difficulty heretofore has been that each resonant frequency can be well-defined in theory, but not in actuality since fabrication of the MEM resonators relies on conventional micromachining processes which utilize photolithographic reticles (also termed masks) having a fixed granularity due to a predetermined grid size G of the reticles. Specially fabricating a new set of photolithographic reticles with a different grid size G, which is specifically tailored to each MEM resonator, is costly so what is needed is a way of fabricating one or more MEM resonators based on a single set of photolithographic reticles having a fixed grid size G while providing an actual resonant frequency in the fabricated MEM resonators which is close to a desired resonant frequency.

The present invention addresses this limitation in the prior art by providing a method for fabricating one or more MEM resonators with dimensions of various elements in each MEM resonator being determined in terms of integer multiples of the grid size G so that the actual resonant frequency and other parameters of each MEM resonator are closer to initially specified values than is currently possible using conventional fabrication methods.

These and other advantages of the present invention will become evident to those skilled in the art.

SUMMARY OF THE INVENTION

The present invention relates to a method for fabricating a microelectromechanical (MEM) resonator, comprising the steps of: (a) calculating parameters for the MEM resonator for a desired resonant frequency $f_d$, including a sub-width $L=\lambda/2=C_m/2f_d$ and an electrode width $W=\lambda/4=C_m/4f_d$ where $\lambda$ is an acoustic wavelength and $C_m$ is a material speed for the MEM resonator; (b) calculating an actual resonant frequency $f_a=C_m/2L_a=C_m/2NG$ for which the MEM resonator can be fabricated using an actual sub-width $L_a=NG$, with G being a grid size for at least one photolithographic reticle to be used to fabricate the MEM resonator, and with N being calculated from $N=C_m/2f_dG$ rounded to be an integer number for which the actual resonant frequency $f_a$ is nearest to but above the desired resonant frequency $f_d$; (c) calculating the actual resonant frequency using $f_a=C_m(M,N)/2NG$ over at least a part of the range $N/2 \leq M < N$, where M is an integer and $C_m(M,N)$ accounts for changes in the material speed $C_m$ due to an effective electrode width $W_e=MG$ which is different from the electrode width W, and selecting the value of M for which a frequency error $f_e=f_d-f_a=f_d-C_m(M,N)/2NG$ is a minimum; and (d) fabricating the MEM resonator using the actual sub-width $L_a=NG$ and the effective electrode width $W_e=MG$ by: providing a substrate having a plurality of layers deposited thereon, including a lower metallization layer, a piezoelectric layer and an upper metallization layer; photolithographically patterning the upper metallization layer using the at least one photolithographic reticle having the grid size G, thereby forming an upper electrode in each of n actual sub-widths $L_a=NG$ where n is an integer, with each upper electrode having the effective electrode width $W_e=MG$; photolithographically patterning the piezoelectric layer using the at least one photolithographic reticle having the grid size G, thereby defining an overall width $W_o=nL_a=nNG$ for the MEM resonator; and undercutting the MEM resonator with a selective etchant, thereby suspending the MEM resonator on the substrate.

The method can further comprise the step of calculating an effective electrode length $L_e$ for the MEM resonator from $L_e=N\rho/MnR_d$ where $\rho$ is a resistivity per unit length of each upper electrode in the MEM resonator, and $R_d$ is a desired motional impedance for the MEM resonator, and with the effective electrode length $L_e$ being rounded to be an integer multiple of the grid size G. The effective electrode length $L_e$ can then be used in fabricating the MEM resonator in step (d) above.

The method can also optionally comprise the steps of: increasing the value of N by one; repeating step (c), and selecting the value of M for which the frequency error $f_e$ is a minimum; and selecting whichever values of N and M provide the lowest frequency error $f_e$ for use in fabricating the MEM resonator in step (d) above. The steps in this paragraph of increasing the value of N by one, repeating step (c), selecting the value of M for which the frequency error $f_e$ is a minimum, and selecting whichever values of N and M provide the lowest frequency error $f_e$ can be repeated a number of times, if needed, to optimize the values of N and M to be used in fabricating the MEM resonator in step (d), with the value of N being increased by one each time this sequence of steps is repeated.

In the method of the present invention, the desired resonant frequency $f_d$ can be, for example, in the range of 10 MHz to 10 GHz. The step of calculating parameters for the MEM resonator can comprise calculating parameters for the MEM resonator with the piezoelectric layer comprising a piezoelectric material selected from the group consisting of aluminum nitride (AlN), lithium niobate (LiNbO$_3$), zinc oxide (ZnO), and lead-zirconate-titanate (PZT).

The present invention further relates to a method for fabricating a microelectromechanical (MEM) resonator, which comprises the steps of: (a) calculating parameters for the MEM resonator for a desired resonant frequency $f_d$, including a sub-width $L=\lambda/2=C_m/2f_d$ and an electrode width $W=\lambda/4=C_m/4f_d$ where $\lambda$ is an acoustic wavelength and $C_m$ is a material speed for the MEM resonator; (b) calculating an actual resonant frequency $f_a=C_m/2L_a=C_m/2NG$ for which the MEM resonator can be fabricated using an actual sub-width $L_a=NG$ where G is a grid size for at least one photolithographic reticle to be used to fabricate the MEM resonator and N is calculated from $N=C_m/2f_dG$ rounded to be an integer number for which $f_a$ is nearest to but below the desired resonant frequency $f_d$; (c) calculating the actual resonant frequency using $f_a=C_m(M,N)/2NG$ over at least a part of the range $1 \leq M < N/2$, where M is an integer and $C_m(M,N)$ accounts for changes in the material speed $C_m$ due to an effective electrode width $W_e=MG$ which is different from the electrode width W, and selecting the value of M for which a frequency error $f_e=f_d-f_a=f_d-C_m(M,N)/2NG$ is a minimum; and (d) fabricating the MEM resonator using the actual sub-width $L_a=NG$ and the effective electrode width $W_e=MG$ by: providing a substrate having a plurality of layers deposited thereon, including a lower metallization layer, a piezoelectric layer and an upper metallization layer; photolithographically patterning the upper metallization layer using the at least one photolithographic reticle having the grid size G, thereby forming an upper electrode in each of n actual sub-widths $L_a=NG$ where n is an integer, with each upper electrode having the effective electrode width $W_e=MG$; photolithographically patterning the piezoelectric layer using the at least one photolithographic reticle having the grid size G, thereby defining an overall width $W_o=nL_a=nNG$ for the MEM resonator; and undercutting the MEM resonator with a selective etchant, thereby suspending the MEM resonator on the substrate.

The method can further comprise the step of calculating an effective electrode length $L_e$ for the MEM resonator from $L_e=N\rho/MnR_d$ where $\rho$ is a resistivity per unit length of each electrode in the MEM resonator, and $R_d$ is a desired motional impedance for the MEM resonator, and with the effective electrode length $L_e$ being rounded to be an integer multiple of the grid size G. The effective electrode length $L_e$ can then be used in fabricating the MEM resonator in step (d) above.

The method can also optionally comprise the steps of: decreasing the value of N by one; repeating step (c), and selecting the value of M for which the frequency error $f_e$ is a minimum; and selecting whichever values of N and M provide the lowest frequency error $f_e$ for use in fabricating the MEM resonator in step (d) above. The steps in this paragraph of decreasing the value of N by one, repeating step (c), selecting the value of M for which the frequency error $f_e$ is a minimum, and selecting whichever values of N and M provide the lowest frequency error $f_e$ can be repeated a number of times, if needed, to optimize the values of N and M to be used in fabricating the MEM resonator in step (d), with the value of N being decreased by one each time this sequence of steps is repeated.

The desired resonant frequency $f_d$ can be, for example, in the range of 10 MHz to 10 GHz. The step of calculating parameters for the MEM resonator can comprise calculating parameters for the MEM resonator with the piezoelectric layer comprising a piezoelectric material selected from the group consisting of aluminum nitride (AlN), lithium niobate ($LiNbO_3$), zinc oxide (ZnO), and lead-zirconate-titanate (PZT).

The present invention also relates to a method for fabricating a number j of microelectromechanical (MEM) resonators on a common substrate which comprises the steps of: (a) calculating parameters for each MEM resonator for a desired resonant frequency $f_{di}$ with $i=1,\ldots,j$, including a sub-width $L_i=\lambda_i/2=C_{mi}/2f_{di}$ and an electrode width $W_i=\lambda_i/4=C_{mi}/4f_{di}$ for that MEM resonator where $\lambda_i$ is an acoustic wavelength and $C_{mi}$ is a material speed for that MEM resonator; (b) calculating an actual resonant frequency $f_{ai}=C_{mi}/2L_{ai}=C_{mi}/2N_iG$ for which each MEM resonator can be fabricated using an actual sub-width $L_{ai}=N_iG$ for that MEM resonator where G is a grid size for at least one photolithographic reticle to be used to fabricate the number j of MEM resonators, and $N_i$ for each MEM resonator is calculated from $N_i=C_{mi}/2f_{di}G$ rounded to be an integer number for which $f_{ai}$ is nearest to but above the desired resonant frequency $f_{di}$ for that MEM resonator; (c) calculating the actual resonant frequency using $f_{ai}=C_{mi}(M_i,N_i)/2N_iG$ for each MEM resonator over at least a part of the range $N_i/2 \leq M_i < N_i$ where $M_i$ is an integer and $C_{mi}(M_i,N_i)$ accounts for changes in the material speed $C_{mi}$ due to an effective electrode width $W_{ei}=M_iG$ which is different from the electrode width $W_1$ for that MEM resonator, and selecting the value of $M_1$ for which a frequency error $f_{ei}=f_{di}-f_{ai}=f_{di}-C_{mi}(M_i,N_i)/2N_iG$ is a minimum for that MEM resonator; and (d) fabricating the number j of MEM resonators using the actual sub-widths $L_{ai}=N_iG$ and the effective electrode widths $W_{ei}=M_iG$ for $i=1,\ldots,j$ by: providing a substrate having a plurality of layers deposited thereon, including a lower metallization layer, a piezoelectric layer and an upper metallization layer; photolithographically patterning the upper metallization layer using the at least one photolithographic reticle having the grid size G, thereby forming $n_i$ upper electrodes in each of the j MEM resonators, with the $n_i$ upper electrodes in each MEM resonator having the effective electrode width $W_{ei}=M_iG$; photolithographically patterning the piezoelectric layer using the at least one photolithographic reticle having the grid size G, thereby defining an overall width $W_{oi}=n_iL_{ai}=n_iN_iG$ for each MEM resonator where $i=1,\ldots,j$; and undercutting the number j of MEM resonators with a selective etchant, thereby suspending each MEM resonator on the substrate.

The method can further comprise the step of calculating an effective electrode length $L_{ei}$ for each MEM resonator from $L_{ei}=N_i\rho/M_in_iR_{di}$ where $\rho$ is a resistivity per unit length of each upper electrode in the number j of MEM resonators, and $R_{di}$ is a desired motional impedance for each MEM resonator, and with the effective electrode length $L_{ei}$ being rounded to be an integer multiple of the grid size G. The number j of MEM resonators can then be fabricated in step (d) above using the effective electrode lengths $L_{ei}$.

In some cases, the method can further comprise the steps of: increasing the values of $N_i$ by one; repeating step (c), and selecting the values of $M_i$ for which the frequency error $f_{ei}$ is a minimum; selecting whichever values of $N_i$ and $M_i$ provide the lowest frequency error $f_{ei}$ for each MEM resonator, and using these values of $N_i$ and $M_i$ in fabricating the number j of MEM resonators in step (d). The steps in this paragraph of increasing the values of $N_i$ by one, repeating step (c), selecting the values of $N_i$ for which the frequency error $f_{ei}$ is a minimum for each MEM resonator, and selecting whichever values of $N_i$ and $M_i$ provide the lowest frequency error $f_{ei}$ for each MEM resonator can be repeated a number of times, if needed, to optimize the values of $N_i$ and $M_i$ to be used in fabricating the number j of MEM resonators in step (d), with the values of $N_i$ being increased by one each time this sequence of steps is repeated.

The desired resonant frequency $f_{di}$ at which each MEM resonator is to operate can be, for example, in the range of 10 MHz to 10 GHz. The step of calculating parameters for each MEM resonator can comprise calculating parameters for that MEM resonator with the piezoelectric layer comprising a piezoelectric material selected from the group consisting of aluminum nitride (AlN), lithium niobate (LiNbO$_3$), zinc oxide (ZnO), and lead-zirconate-titanate (PZT).

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 2 shows various steps in the method of the present invention as applied to the MEM resonator in the example of FIGS. 1A and 1B to produce the fabricated MEM resonator of FIG. 1C.

FIG. 5 shows additional steps in the method of the present invention which can be used to determine parameters for fabricating the MEM resonators in FIG. 3, including a an effective electrode length $L_{ei}$ and an overall width $W_{oi}$ for each MEM resonator.

DETAILED DESCRIPTION OF THE INVENTION

Figure 1A:
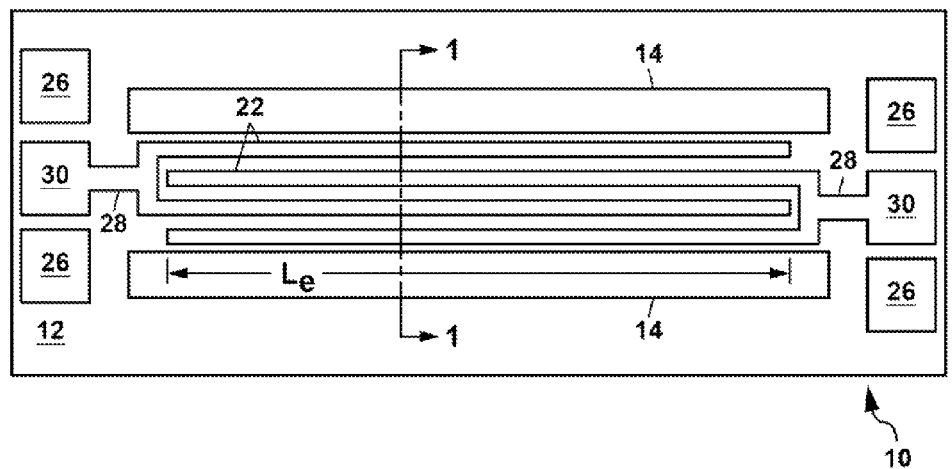
FIG. 1A shows a schematic plan view of an example of a MEM resonator to which the method of the present invention can be applied.
Figure 1B:
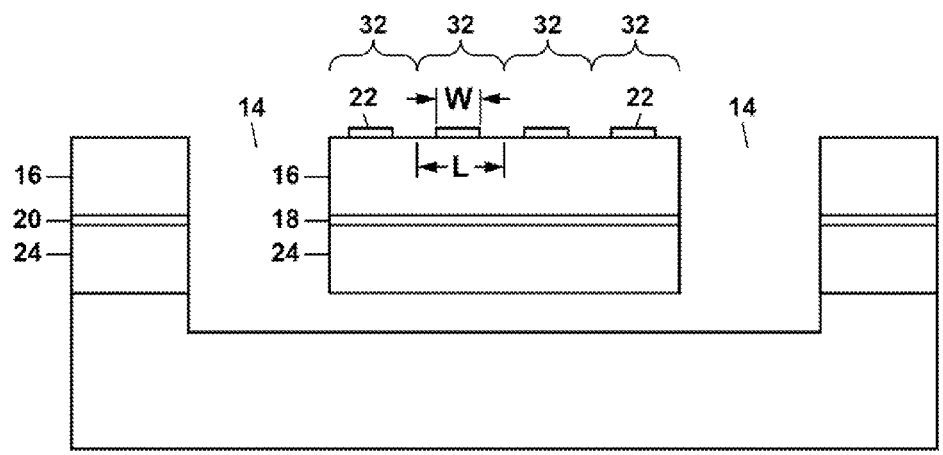
FIG. 1B shows a schematic cross-section view of the MEM resonator of FIG. 1A along the section line 1-1 in FIG. 1A.
Figure 1C:
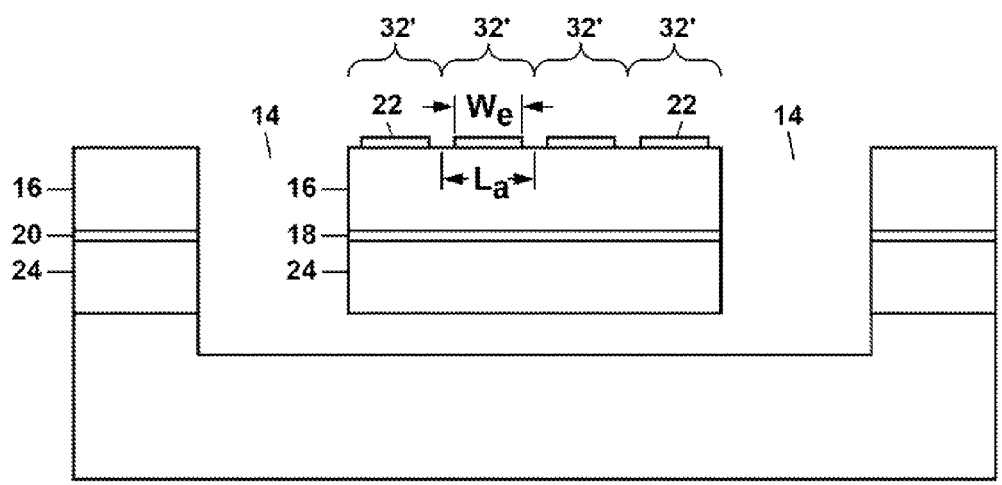
FIG. 1C shows a schematic cross-section view of the MEM resonator of FIG. 1A along the section line 1-1 in FIG. 1A after fabrication using the method of the present invention.

Referring to FIG. 1A there is shown a schematic plan view of an example of a microelectromechanical (MEM) resonator 10 to which the method of the present invention can be applied. In FIG. 1A, the MEM resonator 10 is located on a substrate 12 and is suspended at least partially therefrom, with a trench 14 being formed about and underneath the MEM resonator 10. This trench 14 can be seen in FIG. 1B which is a schematic cross-section view along the section line 1-1 in FIG. 1A. In FIG. 1B the MEM resonator 10 is shown with various parameters including a sub-width L and an electrode width W which are ideally needed to provide a desired resonant frequency $f_d$. FIG. 1C shows a schematic cross-section view along the section line 1-1 in FIG. 1A of the MEM resonator 10 as fabricated after application of the method of the present invention to determine an actual sub-width $L_a$ and an effective electrode width $W_e$. Generally, both the actual sub-width $L_a$ and the effective electrode width $W_e$ will differ from the ideal sub-width L and the ideal electrode width W due to fabrication constraints imposed by a grid size G of one or more photolithographic reticles used in fabricating the MEM resonator 10.

The MEM resonator 10 in the example of FIGS. 1A-1C is a contour mode resonator 10 which comprises a layer 16 of a piezoelectric material which can be electrically transduced to oscillate in a width extensional mode via a $d_{31}$ piezoelectric coefficient, with an acoustic wave in the piezoelectric material being directed orthogonal to an electric field used to induce the acoustic wave. The MEM resonator 10 can comprise a lower electrode 18, which can be formed from the deposition of a lower metallization layer on the substrate 12 prior to depositing the piezoelectric layer 16. This lower metallization can also be used to form a ground plane 20 about the MEM resonator 10. In FIGS. 1A-1C, the MEM resonator 10 also comprises a number n of upper electrodes 22 which can be formed by depositing and patterning an upper metallization layer over the piezoelectric layer 16. In the example of FIGS. 1A-1C, four upper electrodes 22 are shown with the MEM resonator operating as an overtone resonator with a fourth order resonant mode. The number n of upper electrodes 22 can be an arbitrary integer number which can be predefined, or determined according to the method of the present invention.

In the example of FIGS. 1A-1C a silicon dioxide layer 24 is located beneath the lower electrode 18. This silicon dioxide layer 24, which is optional, is useful to provide temperature compensation for the piezoelectric layer 16 to stabilize a resonant frequency of the MEM resonator 10. The silicon dioxide layer 24 can also be used as an etch stop layer for extending the trench 14 beneath the MEM resonator 10 by etching away a portion of the substrate 12 and thereby suspending the resonator 10 from the substrate 12.

The MEM resonator 10 of FIGS. 1A-1C can be formed on many different types of substrates 12 including semiconductor substrates (e.g. comprising silicon, germanium, gallium arsenide, indium phosphide, etc.) or insulating substrates (e.g. comprising glass, alumina, sapphire, etc.). The term "silicon" as used herein includes monocrystalline silicon substrates and silicon-on-insulator substrates. The term "glass" as used herein is defined to encompass any type of glass known to the art including silicon dioxide, fused silica and crystalline quartz. When the MEM resonator 10 of FIGS. 1A-1C and the other examples of MEM resonators described hereinafter are formed on a semiconductor substrate 12, the substrate 12 can, in some cases, include electronic circuitry (e.g. CMOS circuitry) formed on the substrate 12 with one or more of the MEM resonators being formed above or along side of the electronic circuitry (e.g. above a passivation layer which covers CMOS circuitry).

The process for forming the MEM resonators 10 of FIG. 1A-1C will be described hereinafter using a silicon substrate 12. Those skilled in the art will understand that the various process steps used to form the MEM resonator 10 can be readily adapted for use with other types of substrates 12, or to form the MEM resonator 10 above a passivation layer on a substrate 12 containing electronic circuitry (e.g. for use in forming an oscillator or clock).

In FIGS. 1B and 1C, the silicon dioxide layer 24 can be deposited or formed over the silicon substrate 12 with a layer thickness up to about one micron (μm) or more. When the silicon dioxide layer 24 is to be used for temperature compensation, the exact thickness of the silicon dioxide layer 24 will be determined by the thickness and composition of the overlying piezoelectric layer 16. As an example, when the piezoelectric layer 16 comprises 0.75 μm of aluminum nitride (AlN), the silicon dioxide layer 24 can have a thickness in the range of 0.90-1.15 μm. The positive thermal coefficient of expansion of the silicon dioxide layer 24 can compensate for the negative thermal coefficient of expansion of the AlN piezoelectric material. In this way, the thermal coefficient of expansion of the AlN piezoelectric material can be effectively reduced from about 33 parts-per-million (ppm) per degree Celsius (° C.) to about 2 ppm/° C. or less for the composite AlN/SiO$_2$ layers.

The silicon dioxide layer 24 can be formed, for example, by a conventional wet oxidation process whereby the silicon substrate material is oxidized to form SiO$_2$ at an elevated temperature (e.g. 1050° C.). Alternately, the silicon dioxide layer 24 can be deposited by a chemical vapor deposition (CVD) process (e.g. low-pressure CVD or plasma-enhanced CVD). In some embodiments of the present invention, the silicon dioxide layer 24 can be omitted altogether (e.g. when temperature compensation is not required, or when a glass substrate 12 is used, or when the lower metallization layer is chemically resistant to an etchant which is used to etch the trench 14). In yet other embodiments of the present invention, a silicon nitride layer can be substituted for the silicon dioxide layer 24 for use at an etch stop layer, or can be used in combination with the silicon dioxide layer 24. The silicon nitride layer can be up to a few hundred nanometers (nm) thick, and can be deposited by a CVD process.

When the MEM resonator 10 is to be formed on a silicon substrate 12 containing CMOS circuitry, a layer of polycrystalline silicon (also termed polysilicon) can be deposited over a passivation layer covering the CMOS circuitry prior to depositing the silicon dioxide layer 24. In this case, the polysilicon and silicon dioxide layers can be deposited by plasma-enhanced CVD (PECVD) at a temperature which is preferably less than about 400° C. to prevent damaging the CMOS circuitry.

In FIGS. 1B and 1C, the lower metallization layer, which is used to form the lower electrode 18 and the ground plane 20, can be deposited over the silicon dioxide layer 24 and patterned by reactive ion etching. This can be done by forming an etch mask over the lower metallization layer using a photolithographic reticle. The etch mask can comprise a resist or can be a hard etch mask formed of silicon nitride or a silicate glass such as TEOS (tetraethylortho silicate). In some cases, patterning of the lower metallization layer can take place during the reactive ion etching step which is used to pattern the piezoelectric layer 16.

This lower metallization layer can also be used to form wiring connected to the lower electrode 18 and the ground plane 20, and to form one or more ground bond pads 26, as needed. When the MEM resonator 10 is formed over CMOS circuitry, the wiring connected to the lower electrode 18 and ground plane 20 can comprise one or more vias (not shown) which can be formed by etching openings down to contact the CMOS circuitry and then filling the openings with an electrically-conductive material such as tungsten. These vias can be formed prior to depositing the lower metallization layer. The lower metallization layer can comprise aluminum (e.g. an aluminum alloy containing 1% copper), or alternately can be formed of layers of titanium (Ti) about 50 nm thick, titanium nitride (TiN) about 20 nm thick and aluminum (Al) about 50 nm thick. The lower metallization layer can be deposited, for example, by sputtering.

The piezoelectric layer 16 can be blanket deposited over the substrate 12 and over the patterned lower metallization layer by sputtering at a temperature of about 350° C., with the thickness of the piezoelectric layer 16 being, for example, 0.75-1 µm. The piezoelectric material forming the layer 16 can comprise aluminum nitride (AlN), zinc oxide (ZnO), lithium niobate (LiNbO$_3$) or lead-zirconate-titanate (PZT). The piezoelectric material can be highly c-axis oriented to provide a strong piezoelectric coupling. Those skilled in the art will understand that other types of piezoelectric materials known to the art can be used to form the MEM resonator 10 in the example of FIGS. 1A-1C and the other examples presented hereinafter.

After deposition, the piezoelectric layer 16 can be patterned using a photolithographically-defined etch mask (not shown) and a reactive ion etching step. This reactive ion etching step can etch down to expose the silicon substrate 12 (or a polysilicon layer) beneath the piezoelectric layer 16.

An upper metallization layer can be deposited over the piezoelectric layer 16 and patterned by reactive ion etching or liftoff to form a plurality of upper electrodes 22 to provide signal inputs and signal outputs for the MEM resonator 10. This upper metallization can also be patterned to form wiring 28 and bond pads 30 to provide electrical input and output connections to the MEM resonator 10. In some cases, patterning of the upper metallization layer to form the upper electrodes 22 can take place prior to patterning the piezoelectric layer 16.

In patterning the upper metallization layer to form the wiring 28 and bond pads 30, the piezoelectric layer 16 can be left in place beneath the wiring 28 and bond pads 30 to serve as an electrical insulator. Alternately, the piezoelectric layer 16 can be removed from the substrate 12 in areas reserved for the wiring 28 and bond pads 30; and a layer of an electrically-insulating material such as silicon dioxide or silicon nitride can deposited over the ground plane 20 in these areas for use as an electrical insulator. This can be done prior to depositing the upper metallization which forms the wiring 28 and bond pads 30.

After forming the upper electrodes 22, an undercutting step can be used to remove the substrate material underneath at least a part of the MEM resonator 10 to suspend the MEM resonator 10 above the substrate 12. For a silicon substrate 12, this undercutting step can performed using a selective etchant which etches away a portion of the substrate material (or a layer of polysilicon), but which does not appreciably etch the other deposited layers including the silicon dioxide layer 24, the lower electrode 18 and the ground plane 20 formed from the lower metallization layer, the piezoelectric layer 16 and the upper electrodes 22 formed from the upper metallization layer. The selective etchant can comprise, for example, gaseous silicon hexafluoride (SF$_6$) or xenon difluoride (XeF$_2$). These etchants are preferred for silicon and polysilicon since they are dry etchants which isotropically etch away the silicon while preventing the possibility for stiction of the suspended MEM resonator 10 to the underlying substrate 12.

In the example of FIGS. 1A-1C, the MEM resonator 10 is an overtone contour-mode resonator which operates in an overtone mode (i.e. a higher-order mode). The mode order of this MEM resonator 10 is determined by a number n of sub-widths 32 or 32' which make up an overall width of the resonator 10. In the example of FIGS. 1A-1C, four sub-widths 32 or 32' are shown (i.e. n=4) so that this MEM resonator 10 operates in a fourth-order mode. The number of upper electrodes 22 also corresponds to the number n of sub-widths 32 or 32' since each electrode 22 is needed to interact with the acoustic mode to provide an input or output signal for the MEM resonator 10. In the example of FIGS. 1A-1C, two of the four upper electrodes 22 are used as input electrodes to stimulate the piezoelectric layer 16 to oscillate at a resonant frequency, and the remaining two upper electrodes 22 are used as output electrodes to provide an electrical output signal at the resonant frequency from the oscillating piezoelectric layer 16.

In the ideal case shown in the schematic cross-section view of FIG. 1B, each sub-width 32 will have a width $L=\lambda/2=C_m/$ $2f_d$ where $f_d$ is a desired resonant frequency for the MEM resonator 10, $C_m$ is a material speed (i.e. a speed in which an acoustic wave propagates through the piezoelectric material in the layer 16) in the MEM resonator 10, and $\lambda$ is a wavelength of the acoustic wave in the MEM resonator 10. Also, in the ideal case, each upper electrode 22 will have a width $W=\lambda/4=C_m/4f_d$.

In actuality, however, it is generally not be possible to fabricate the MEM resonator 10 with the ideal dimensions L and W shown in FIG. 1B to provide the desired resonant frequency $f_d$ since the MEM resonator 10 must be fabricated using one or more photolithographic reticules (also termed masks) which have a fixed grid size G. To produce the reticles, the grid size G (e.g. 5 nanometers) must be initially specified, with each feature defined in the reticles having lateral dimensions which must be an integer multiple of the grid size G. As a result, the MEM resonator 10 as fabricated must have lateral dimensions which are also integer multiples of the grid size G. Thus, it is generally not possible to form the MEM resonator 10 to operate at the desired resonant frequency $f_d$ since the actual dimensions of the fabricated MEM resonator 10 will deviate from the ideal requirements that the sub-width be $L=\lambda/2=C_m/2f_d$ and that the electrode width be $W=\lambda/4=C_m/4f_d$. This presents a serious problem when the MEM resonator 10 must operate at a precise resonant frequency, for example, to form an oscillator or a clock, or when a plurality of MEM resonators 10 must operate at precise resonant frequencies, for example, to form a channel-selection filter for a radio transmitter or receiver where each resonant frequency must be precisely defined, or where the resonant frequencies for the MEM resonators 10 must be spaced apart by a precise frequency interval $\Delta f$.

Prior to the present invention, MEM resonators have required individual tuning (i.e. trimming) of the resonant frequency after manufacture; and this is costly and time consuming. Such tuning has been performed, for example, by electrically connecting external components such as capacitors to the MEM resonators, or by altering the mass of the MEM resonators by laser trimming.

The present invention provides a method 100 that addresses this deficiency in the prior art by providing a way of more precisely defining the resonant frequency of one or more MEM resonators prior to manufacture so that the MEM resonators 10, as fabricated, operate very close to the desired resonant frequency $f_d$. With the method of the present invention an actual sub-width $L_a$ and an effective electrode width $W_e$ as shown in FIG. 1C and other parameters of the MEM resonator 10 as described hereinafter can be calculated in terms of integer multiples of the grid size G so that the MEM resonator 10 can be fabricated with a precision on the order of about $10^{-3}$ of the desired resonant frequency $f_d$ or better. These calculations used in the method of the present invention as described hereinafter can be performed on a computer, or by hand.

FIG. 2 illustrates the steps used by the method 100 of the present invention for a single MEM resonator 10 as shown in FIGS. 1A-1C. In FIG. 2, the method 100 is initiated in step 102 by calculating parameters for the MEM resonator 10 for a desired resonant frequency $f_d$ at which the MEM resonator 10 is to operate. This desired resonant frequency $f_d$ can be, for example, in the range of about 10 megaHertz (MHz) to about 10 gigaHertz (GHz). The parameters to be calculated for the MEM resonator 10 in step 102 include the sub-width 32 in FIG. 1B, which is given by the ideal equation $L=\lambda/2=C_m/2f_d$, and the electrode width W which is given by the ideal equation $W=\lambda/4=C_m/4f_d$.

In step 104 of the method 100 of the present invention, an actual resonant frequency $f_a=C_m/2L_a$ is calculated for the MEM resonator 10 where $L_a$ is an actual sub-width 32' for which the MEM resonator 10 can be fabricated given the constraint imposed by a predefined grid size G for one or more photographic reticules which will be used to fabricate the MEM resonator 10. The actual sub-width 32' as shown in FIG. 1C is close to the ideal sub-width L, but is given by $L_a=NG$ where N is an integer number for which $f_a$ is nearest to but above the desired resonant frequency $f_d$. Thus, for example, if the material speed $C_m$ is 8500 meters per second (m/s) and the desired resonant frequency is $f_d$=1.802 GHz, then the ideal sub-width L would be given by:

$$L=\lambda/2=C_m/2f_d=(8500 \text{ m/s})/(2\times1.802 \text{ GHz})=2.3585 \text{ }\mu\text{m}$$

And, for a grid size G=5 nanometers (nm), N would be determined by setting $L_a=NG=2.3585$ μm and solving for N, with N then being rounded up to the nearest integer. Thus, N=2.3585 μm/5 nm=471.7 which, when rounded up to the nearest integer gives the result N=472, and when rounded down to the nearest integer gives the result N=471. For this example, the actual resonant frequencies $f_a$ which could be fabricated for the MEM resonator 10 using the grid size G=5 nm would be given by:

$$f_a=C_m/2L_a=C_m/2NG=(8500 \text{ m/s})/(2\times472\times5 \text{ nm})=1.801 \text{ GHz}$$

and $$f_a=C_m/2L_a=C_m/2NG=(8500 \text{ m/s})/(2\times471\times5 \text{ nm})=1.805 \text{ GHz}$$

Thus, a frequency error $f_e=f_d-f_a$ between the desired and actual resonant frequencies can be up to a few MHz or more depending upon the grid size G; and this amount of frequency error $f_e$ can be unacceptable for many applications of MEM resonators including high-precision oscillators and channel-selection filters.

For the above example, N=471 can be used in step 104 of the method 100 to provide an actual resonant frequency $f_a$ which is nearest to but above the desired resonant frequency $f_d$. This allows the actual resonant frequency $f_a$ to be tuned down in frequency to be closer to the desired resonant frequency $f_d$ by fabricating the MEM resonator 10 with an effective electrode width $W_e$ for the upper electrodes 22 which is not equal to the ideal value $W=\lambda/4=C_m/4f_d$, but instead is given by $W_e=MG$ where M is an integer in the range of $N/2 \leq M<N$. Thus, for the above example, with N=471, M would be in the range of 236 to 471. For each value of M over at least a part of the range $N/2 \leq M<N$, the actual resonant frequency $f_a$ can be calculated and the frequency error $f_e=f_d-f_a$ can be determined. Then the value of M for which $f_e$ is a minimum can be selected. This is shown in FIG. 2 as step 106. Generally, it is not necessary to calculate the actual resonant frequency $f_a$ for all of the values of M in the range of $N/2 \leq M<N$ since a trend in the change in $f_a$ with the change in M can be ascertained; and this trend can be used to narrow down the range of values of M for which the calculations are needed. Thus, for example, in some cases, it may be necessary only to calculate the actual resonant frequency $f_a$ for a small range of values of M near N/2.

By changing the effective electrode width $W_e$ according to the method 100 of the present invention, the mass of each upper electrode 22 can be changed; and this change in the electrode mass can affect the material speed $C_m$ in the piezoelectric layer 16 which, in turn, can change the actual resonant frequency $f_a$ of the MEM resonator 10. The material speed $C_m$ as the effective electrode width $W_e$ deviates from the ideal electrode width $W=\lambda/4$ is given by the approximation:

$$C_m \approx (M,N)C_{m0}+C_{m1}(W_e/W)+C_{m2}(W_e/W)^2 = C_{m0}+C_{m1}(2M/N)+C_{m2}(2M/N)^2$$

which is also dependent upon the integers N and M determined according to the present invention. In the above approximation, $C_{m0}$, $C_{m1}$ and $C_{m2}$ are constants which can be determined from practice of the present invention by varying the effective electrode width $W_e$=MG in a number of different MEM resonators 10 having the same value of N (i.e. the same actual sub-width $L_a$=NG) and measuring the actual resonant frequency $f_a$ for each MEM resonator 10.

Returning to step 106 in FIG. 2, the material speed $C_m(M,N)$ as determined above can be used in calculating $f_a$ for the different values of the effective electrode width $W_e$=MG over the range of M given by $N/2 \leq M < N$ or over a more limited range of values of M as discussed above, and the frequency error $f_e = f_d - f_a$ can be determined for each value of M. From this information, the value of M for which $f_e$ is a minimum can be selected. Then, with the values of the integers N and M determined, the MEM resonator 10 can be fabricated as shown in FIG. 1C using the actual sub-width 32' with $L_a$=NG and the effective electrode width $W_e$=MG.

In some cases (e.g. when the desired resonant frequency $f_d$ is very high so that the actual sub-width $L_a$ is very small), the value of N can be increased by one, and step 106 can be repeated to see if this increase in the value of N and a different value of M can provide a lower frequency error $f_e$ than that determined in the initial application of step 106. This process can be repeated multiple times with N being increased by one each time to determine the exact values of N and M which provide the minimum frequency error $f_e$. Thus, according to the method 100 of the present invention, there can be a trade off between the values of N and M to determine the lowest frequency error $f_e$ (i.e. both the actual sub-width $L_a$=NG and the effective electrode width $W_e$=MG can be varied and optimized to determine the values of N and M which provide the minimum frequency error $f_e$). This is due to the grid size G which results in there being one set of discrete values of the actual resonant frequency $f_a$ in the MEM resonator 10 as N is varied with M being fixed, and a different set of discrete values of $f_a$ as M is varied with N being fixed. For certain values of N and M, these two sets of discrete values of $f_a$ can be interspersed so that increasing N as described above and repeating step 106 is needed to determine the optimal values of N and M which provide the lowest frequency error $f_e$. These optimal values of N and M can then be used in fabricating the MEM resonator 10 in step 108 in FIG. 2.

In other cases, it may be possible to provide the minimum frequency error $f_e$ by selecting a value of N for which $f_a$ is nearest to but below the desired resonant frequency $f_d$. This again is due to the grid size G producing discrete values of the actual resonant frequency $f_a$ in the MEM resonator 10. In these other cases, when the method 100 of the present invention is used, step 104 in FIG. 2 can be modified so that the effective electrode width $W_e$ is now reduced below the ideal value $W=\lambda/4$. Step 106 in FIG. 2 can also be modified for these other cases, with $f_a$ being calculated for different values of $W_e$=MG, with M now being an integer in the range of $1 \leq M < N/2$. Once the various values of $W_e$ are determined for M over at least a part of this new range of $1 \leq M < N/2$, the frequency error $f_e = f_d - f_a$ can be calculated and the value of M can be selected for which the frequency error $f_e$ is a minimum. Step 108 can then be performed to fabricate the MEM resonator 10 using the actual sub-width $L_a$=NG and the effective electrode width $W_e$=MG using the values of N and M which provide the minimum frequency error. If needed, due to the discrete values of the actual resonant frequency $f_a$ with N and M, the value of N can be decreased by one and step 106 can be repeated again for M in the range of $1 \leq M < N/2$ for these other cases. This can be done one or more times, with N being decreased each time until the optimal values of N and M are determined for which provide the lowest frequency error $f_e$. These optimal values of N and M can then be used in fabricating the MEM resonator 10 in step 108 in FIG. 2.

In fabricating the MEM resonator 10 in the example of FIGS. 1A-1C, additional parameters for the MEM resonator 10 can also be determined and optimized. These parameters can include the number n of the actual sub-widths $L_a$=NG which will fit into an overall width $W_o$=$nL_a$ for the MEM resonator 10 when the number n is not initially specified or known, and a desired motional impedance $R_d$ (e.g. 50Ω) for the MEM resonator 10 to provide impedance matching to a source or a load. In some cases, the constraint of a maximum width $W_m$ for the MEM resonator 10 may be present so that an overall width $W_o$ of the MEM resonator 10, as fabricated, will need to fit within the constraint of the maximum width $W_m$. Determining the overall width $W_o$ for each MEM resonator 10 can be important when the space on the substrate 12 allocated for one or more MEM resonators 10 is limited for some reason, or when a plurality of MEM resonators 10 must fit onto a common substrate 12 of a given size.

As previously discussed, the number n corresponds to the mode order of the MEM resonator 10 and is also the number of upper electrodes 22 in the MEM resonator 10. The number n of actual sub-widths 32' with $L_a$=NG which will fit into the maximum width $W_m$ specified for the MEM resonator 10 can be determined from $n=W_m/L_a=W_m/NG$ with n being rounded down to be an integer number. The overall width $W_o$ for the MEM resonator 10 will then be $W_o$=$nL_a$=nNG where n is the integer number determined above.

When the effective width $W_e$ of the upper electrodes 22 is changed from the ideal width $W=\lambda/4$, there can be a significant effect on an actual motional impedance $R_a$ of the MEM resonator 10. This is because the actual motional impedance $R_a$ depends inversely on the effective electrode width $W_e$ as shown in the approximation:

$$R_a \approx \lambda \rho / 4n W_e L_e$$

where $\rho$ is a resistivity per unit length for each upper electrode 22 in the MEM resonator 10 and $L_e$ is an effective electrode length of the MEM resonator 10 (see FIG. 1A). Thus, to restore the actual motional impedance $R_a$ to be approximately equal to the desired motional impedance $R_d$, the length $L_e$ can be used to compensate for the effective electrode width $W_e$. In terms of the integers N and M determined from practice of the method 100 of the present invention, the effective electrode length $L_e$ needed to restore the actual motional impedance $R_a$ to be approximately equal to the desired motional impedance $R_d$ is given by:

$$L_e = N\rho/MnR_d$$

where $L_e$ is rounded up or down to be an integer multiple of the grid size G. The values n, $W_o$ and $L_e$ as determined above can then be used in fabricating the MEM resonator 10 in step 108.

In fabricating the MEM resonator 10 as previously described with reference to FIGS. 1A-1C, the substrate 12 can be provided with a plurality of layers deposited thereon as previously described. These layers can include the lower metallization layer used to form the lower electrode 18 and the ground plane 20, the piezoelectric layer 16, and the upper metallization layer used to form the upper electrodes 22.

Photolithographic reticles having the grid size G can be used to pattern the piezoelectric layer 16 to provide the overall width $W_o$ and to pattern the upper metallization layer to form the upper electrode 22 in each of the n actual sub-widths $L_a$, with each upper electrode having the effective electrode width $W_e=MG$ and the effective electrode length $L_e$. These reticles can also be used to pattern the silicon dioxide layer 24, if used, and the lower metallization layer to form the lower electrode 18 and ground plane 20.

The term "patterning" as used herein refers to a series of well-known processing steps used in micromachining and the manufacture of integrated circuits, including applying a photoresist over the substrate 12, pre-baking the photoresist, aligning the substrate 12 with a photolithographic reticle, exposing the photoresist with light transmitted through the reticle, developing the photoresist, baking the substrate 12, etching away the surfaces not protected by the photoresist, and stripping the protected areas of the photoresist so that further processing can take place. These steps can be repeated multiple times, as needed, to build up the structure of the MEM resonator 10. The term "patterning" as used herein can further include the formation of a hard mask (e.g. comprising about 0.5 μm or more of silicon nitride or a silicate glass such as TEOS, which can be deposited from the decomposition of tetraethylortho silicate) over the substrate 12 in preparation for defining features of the MEM resonator 10 by an etching step.

Figure 3:
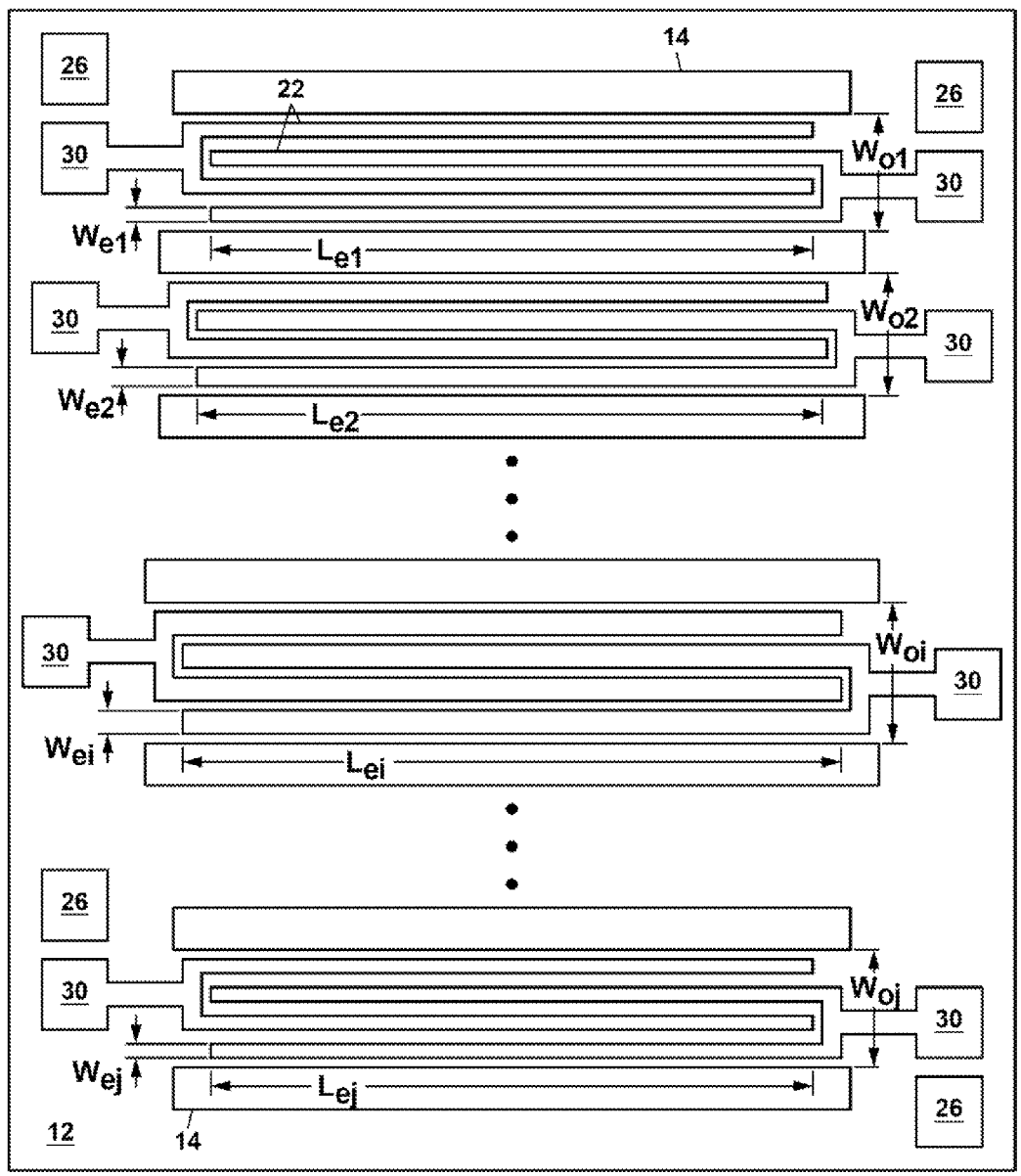
FIG. 3 shows a schematic plan view of an example of a plurality of j MEM resonators formed on a common substrate to which the method of the present invention can be applied.
Figure 4:
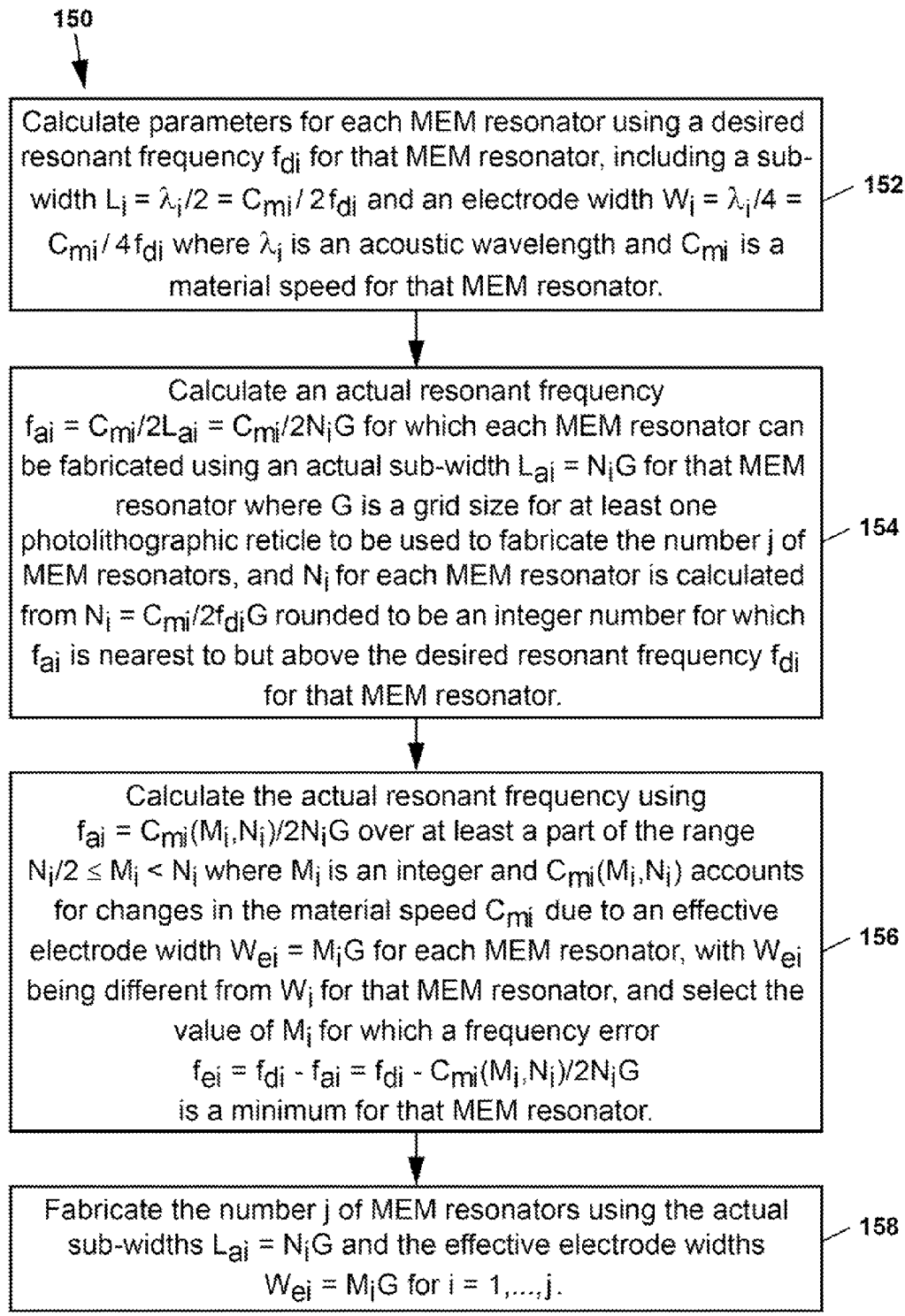
FIG. 4 shows various steps in the method of the present invention as applied to the plurality of j MEM resonators in the example of FIG. 3.

The present invention can also be used for fabricating a number j of MEM resonators 10 on a common substrate 12 where the number j is an arbitrary integer number larger than one, and where an actual resonant frequency $f_a$; for an $i^{th}$ MEM resonator 10 with i=1, . . . , j is also arbitrary (e.g. generally in the range of about 10 MHz to about 10 GHz). This is schematically illustrated FIG. 3 which shows a schematic plan view of a substrate 12 having the j MEM resonators 10 located thereon. Each of the j MEM resonators 10 can be formed as previously described with reference to FIGS. 1A-1C using a piezoelectric material such as AlN, $LiNbO_3$, ZnO or PZT for the piezoelectric layer 16. The example of FIG. 3 is useful, for example, to form a channel-selection filter with a plurality of channels defined by the actual resonant frequencies $f_{ai}$, or to form a plurality of oscillators with each oscillator operating at one of the actual resonant frequencies $f_{ai}$. FIG. 4 shows the steps which can be used according to a method 150 of the present invention for forming the j MEM resonators 10 on the same substrate 12. This method 150 is similar to the method 100 of FIG. 2, but is expanded to encompass the arbitrary number j of MEM resonators 10 formed on the substrate 12.

In FIG. 4, to initiate the method 150, in step 152, parameters can be calculated for each MEM resonator 10 for a desired resonant frequency $f_{di}$ with i=1, . . . , j. These desired resonant frequencies $f_{di}$ will be selected depending upon a particular use for the MEM resonators 10. The parameters which are to be calculated in step 152 can include a sub-width $L_i = \lambda_i/2 = C_{mi}/2f_{di}$ and an ideal electrode width $W_i = \lambda_i/4 = C_{mi}/4f_{di}$ for each MEM resonator 10 with i=1, . . . , j where $\lambda_i$ is an acoustic wavelength and $C_{mi}$ is a material speed for the $i^{th}$ MEM resonator 10.

In step 154, an actual resonant frequency $f_{ai}$ for i=1, . . . , j can be calculated for each of the j MEM resonators 10 which will be fabricated on the common substrate 12 with an actual sub-width 32' given by $L_{ai} = N_iG$ where G is the grid size for one or more photolithographic reticles to be used to fabricate the j MEM resonators 10. In the above equation, $N_i$ is an integer number for which $f_{ai}$ is nearest to but generally above the desired resonant frequency $f_{di}$ for the $i^{th}$ MEM resonator 10 with i=1, . . . , j.

In step 156, the actual resonant frequency is calculated using $f_{ai} = C_{mi}(M_i,N_i)/2N_iG$ over at least a part of the range $N_i/2 \leq M_i < N_i$ where $M_i$ is an integer and $C_{mi}(M_i,N_i)$ accounts for changes in the material speed $C_{mi}$ due to an effective electrode width $W_{ei} = M_iG$ for each MEM resonator 10. The dependence of $C_{mi}(M_i,N_i)$ on the effective electrode width $W_{ei}$ and the integer numbers $N_i$ and $M_i$ is given by the approximation:

$$C_{mi}(M_i,N_i) \approx C_{m0i} + C_{m1i}(W_{ei}/W_i) + C_{m2i}(W_{ei}/W_i)^2 = C_{m0i} + C_{m1i}(2M_i/N_i) + C_{m2i}(2M_i/N_i)^2$$

where $C_{m0i}$, $C_{m1i}$, and $C_{m2i}$ are constants which can be determined from practice of the present invention by varying the effective electrode width $W_{ei} = M_iG$ in a number of different MEM resonators 10 having the same value of $N_i$ (i.e. the same actual sub-width $L_{ai} = N_iG$) and measuring the actual resonant frequency $f_{ai}$ for each MEM resonator 10.

For each MEM resonator 10, a frequency error $f_{ei}$ given by:

$$f_{ei} = f_{di} - f_{ai} = f_{di} - C_{mi}(M_i,N_i)/2N_iG$$

can then be determined for each value of $M_i$; and the value of $M_i$ which provides the minimum frequency error $f_{ei}$ can be selected. As previously noted with respect to step 106 in the method 100 depicted in FIG. 2, it is generally not necessary to perform these calculations for every value of IA over the entire range of $N_i/2 \leq M_i < N_i$ since the trend in the change of the actual resonant frequency $f_{ai}$ with the change in $M_i$ can be ascertained and used to narrow down the range of values of $M_i$ for which the calculations need to be made. Thus, in some cases, the actual resonant frequency $f_{ai}$ for each MEM resonator 10 need only be calculated over a part of the range $N_i/2 \leq M_i < N_i$ (e.g. over a small range of values of $M_i$ near $N_i/2$).

Additionally, in some cases, the value of $N_i$ for each MEM resonator 10 can be increased by one and step 156 in FIG. 4 can be repeated to see if this new value of $N_i$ can provide a lower frequency error $f_{ei}$ than that determined in the initial application of step 156. This process can be repeated multiple times, if needed, with $N_i$ being increased by one each time for each MEM resonator 10 to determine the exact values of $N_i$ and $M_i$ which will provide the lowest frequency error $f_{ei}$ for each MEM resonator 10.

In step 158 in FIG. 4, the j MEM resonators 10 can then be manufactured using the actual sub-widths 32' given by $L_{ai} = N_iG$ and the effective electrode widths $W_{ei} = M_iG$ using the values of $N_i$ and $M_i$ determined using the method 150 which minimizes the frequency error $f_{ei}$ for each of the j MEM resonators 10.

When there are requirements for a maximum width $W_{mi}$ for each MEM resonator 10 (e.g. due to space constraints on the substrate 12), when a number $n_i$ of sub-widths $L_{ai}$ in each MEM resonator 10 is not initially specified or known, or when there are requirements for impedance matching of one or more of the MEM resonators 10 to a source or load using a desired motional impedance $R_{di}$, the method 150 can comprise additional steps as described hereinafter to determine parameters of the MEM resonators 10 including the number $n_i$ of sub-widths $L_{ai}$ in each MEM resonator 10, an overall width $W_{oi}$ for each MEM resonator 10, and an effective electrode length $L_{ei}$ for each MEM resonator 10. These additional steps to the method 150 are outlined in FIG. 5 and are similar to the steps described previously with reference to the method 100 but which are now expanded to encompass a plurality of j MEM resonators 10 located on the same substrate 12.

In step 160, the number $n_i$ of the actual sub-widths 32' given by $L_{ai}=N_iG$ which will fit into the maximum width $W_{mi}$ of each MEM resonator 10 can be calculated, if needed, when $n_i$ is not initially specified or known. This can be done using the equation $n_i=W_{mi}/L_{ai}=W_{mi}/N_iG$ with $n_i$ being rounded down to be an integer number. The number $n_i$ will also be an overtone order for the MEM resonator 10, and will be the number of upper electrodes 22 in each MEM resonator 10. In some cases, when the desired resonant frequencies $f_{di}$ for the j MEM resonators 10 are relatively close to each other, the number $n_i$ can be the same for each MEM resonator so that it is not necessary to calculate $n_i$ for each MEM resonator 10. This is the case for the example shown in FIG. 3 where $n_i=4$.

Although the upper electrodes 22 on an input side (i.e. the left-hand side) of the MEM resonators 10 shown in the example of FIG. 3 are connected together to form a single input, and the upper electrodes 22 on an output side (i.e. the right-hand side) of the MEM resonators 10 in FIG. 3 are also connected together to form a single output, in other embodiments of the present invention, different connection arrangements are possible for the upper electrodes 22 depending upon input and output requirements for the MEM resonators 10. For example, by connecting each upper electrode 22 on the input and output sides of the MEM resonators 10 in FIG. 3 to a separate bond pad 30, the MEM resonators 10 can be formed as differential input/differential output devices 10. As another example, the input sides of more than one of the MEM resonators 10 can be electrically connected together, and the output sides of these MEM resonators 10 can also be electrically connected together. This is useful, for example, to reduce input and output impedances for the MEM resonators 10 when the MEM resonators 10 have substantially the same resonant frequencies $f_{ai}$. This is also useful to form a wideband filter when the MEM resonators 10 have different resonant frequencies $f_{ai}$.

As yet another example, when the number $n_i$ of upper electrodes 22 in one or more of the MEM resonators 10 is an odd integer, these MEM resonators 10 can be formed as balun (balanced/unbalanced) MEM resonators 10. A balun MEM resonator 10 is useful, for example, to provide input and output impedances for the resonator 10 which are different. Thus, as an example, a balun MEM resonator 10 can be used to provide a low input impedance for coupling the input side of the balun MEM resonator 10 to an antenna, and to provide a higher output impedance for coupling an output of the balun MEM resonator 10 to an amplifier, with the balun MEM resonator 10 being used as a filter between the antenna and the amplifier. As another example, a pair of balun MEM resonators 10 having the same resonant frequency $f_{ai}$ can also be formed on the substrate 12 with an opposite orientation and electrically connected together in parallel to form a composite MEM resonator 10 which has substantially the same input and output impedances. Such a composite MEM resonator 10 can be formed either as a single input/single output device 10, or as a differential input/differential output device 10. This can be particularly useful when $n_i$ is an odd integer.

In step 162 in FIG. 5, the effective electrode length $L_{ei}$ for the upper electrodes 22 in each MEM resonator with i=1, ... , j can be determined from the equation $L_{ei}=N_i\rho/M_in_iR_{di}$ where $\rho$ is a resistivity per unit length of the upper electrodes 22 in the number j of MEM resonators 10, and $R_{di}$ is a desired motional impedance for each MEM resonator 10, and with the effective electrode length $L_{ei}$ then being rounded up or down to be equal an integer multiple of the grid size G.

In step 164, which can be consolidated with step 158, the number j of MEM resonators 10 can be fabricated using the effective electrode lengths $L_{ei}$ and with an overall width for each MEM resonator 10 given by $W_{oi}=n_iL_{ai}=n_iN_iG$ in addition the number $n_i$ of sub-widths $L_{ai}=N_iG$ and the effective electrode widths $W_{ei}=M_iG$ where i=1, ..., j.

The step 158 of fabricating the number j of MEM resonators 10 on the common substrate 12 according to the method 150 of the present invention can comprise the step previously described with reference to FIGS. 1A-1C of providing a substrate 12 having a plurality of layers deposited thereon, with the plurality of layers including the lower metallization layer, the piezoelectric layer 16, and the upper metallization layer. The step 158 can also include photolithographically patterning the upper metallization layer and the piezoelectric layer 16 using photolithographic reticles having the grid size G to form the $n_i$ actual sub-widths $L_{ai}$ to provide the overall width $W_{oi}$ for each MEM resonator 10. This photolithographic patterning in step 158, which can comprise two separate patterning steps with different reticles, forms the $n_i$ upper electrodes 22 in each MEM resonator 10 with the effective electrode width $W_{ei}=M_iG$, and can also provide the effective electrode length $L_{ei}$ for each MEM resonator 10. This photolithographic patterning also defines the $n_i$ actual sub-widths $L_{ai}$ for each MEM resonator 10 in the piezoelectric layer 16, and can also define the overall width $W_{oi}$ for each MEM resonator 10. In fabricating the number j of MEM resonators 10 in the step 158, each MEM resonator 10 can be undercut using a selective etchant to suspend that MEM resonator 10 on the common substrate 12. The step 158 can also include packaging the substrate 10 and MEM resonators 10 contained thereon using conventional semiconductor packaging technology. In some cases, as previously discussed, the MEM resonators 10 can be formed over or alongside CMOS circuitry.

Those skilled in the art will understand from the teachings of the present invention, that the methods 100 and 150 can be adapted to form other types of MEM resonators known to the art, including length-extensional contour-mode MEM resonators and Lame MEM resonators.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for fabricating a microelectromechanical (MEM) resonator, comprising the steps of:
   (a) calculating parameters for the MEM resonator for a desired resonant frequency $f_d$, including a sub-width $L=\lambda/2=C_m/2f_d$ and an electrode width $W=\lambda/4=C_m/4f_d$ where $\lambda$ is an acoustic wavelength and $C_m$ is a material speed for the MEM resonator;
   (b) calculating an actual resonant frequency $f_a=C_m/2L_a=C_m/2NG$ for which the MEM resonator can be fabricated using an actual sub-width $L_a=NG$, with G being a grid size for at least one photolithographic reticle to be used to fabricate the MEM resonator, and with N being calculated from $N=C_m/2f_dG$ rounded to be an integer number for which the actual resonant frequency $f_a$ is nearest to but above the desired resonant frequency $f_d$;
   (c) calculating the actual resonant frequency using $f_a=C_m(M,N)/2NG$ over at least a part of the range of $N/2 \leq M<N$, where M is an integer and $C_m(M,N)$ accounts for changes in the material speed $C_m$ due to an effective electrode width $W_e=MG$ which is different from the electrode width W, and selecting the value of M for which a frequency error $f_e=f_d-f_a=f_d-C_m(M,N)/2NG$ is a minimum;

(d) fabricating the MEM resonator using the actual sub-width $L_a=NG$ and the effective electrode width $W_e=MG$ by:

providing a substrate having a plurality of layers deposited thereon, including a lower metallization layer, a piezoelectric layer and an upper metallization layer;

photolithographically patterning the upper metallization layer using the at least one photolithographic reticle having the grid size G, thereby forming an upper electrode in each of n actual sub-widths $L_a=NG$ where n is an integer, with each upper electrode having the effective electrode width $W_e=MG$;

photolithographically patterning the piezoelectric layer using the at least one photolithographic reticle having the grid size G, thereby defining an overall width $W_o=nL_a=nNG$ for the MEM resonator; and undercutting the MEM resonator with a selective etchant, thereby suspending the MEM resonator on the substrate;

increasing the value of N by one;

repeating step (c), and selecting the value of M for which the frequency error $f_e$ is a minimum; and selecting whichever values of N and M provide the lowest frequency error $f_e$ for use in fabricating the MEM resonator in step (d).

2. The method of claim 1 further comprising the step of calculating an effective electrode length $L_e$ for the MEM resonator from $L_e=N\rho/MnR_d$ where $\rho$ is a resistivity per unit length of each upper electrode in the MEM resonator, and $R_d$ is a desired motional impedance for the MEM resonator, and with the effective electrode length $L_e$ being rounded to be an integer multiple of the grid size G.

3. The method of claim 2 wherein the step of photolithographically patterning the upper metallization layer using the at least one photolithographic reticle comprises photolithographically patterning the upper metallization layer to form each upper electrode with the effective electrode length $L_e$.

4. The method of claim 1 wherein the step of calculating parameters for the MEM resonator comprises calculating parameters for the MEM resonator with the piezoelectric layer comprising a piezoelectric material selected from the group consisting of aluminum nitride (AlN), lithium niobate (LiNbO$_3$), zinc oxide (ZnO), and lead-zirconate-titanate (PZT).

5. The method of claim 1 wherein the desired resonant frequency $f_d$ is in the range of 10 MHz to 10 GHz.

6. A method for fabricating a microelectromechanical (MEM) resonator, comprising the steps of:

(a) calculating parameters for the MEM resonator for a desired resonant frequency $f_d$, including a sub-width $L=\lambda/2=C_m/2f_d$ and an electrode width $W=\lambda/4=C_m/4f_d$ where $\lambda$ is an acoustic wavelength and $C_m$ is a material speed for the MEM resonator;

(b) calculating an actual resonant frequency $f_a=C_m/2L_a=C_m/2NG$ for which the MEM resonator can be fabricated using an actual sub-width $L_a=NG$, with G being a grid size for at least one photolithographic reticle to be used to fabricate the MEM resonator, and with N being calculated from $N=C_m/2f_dG$ rounded to be an integer number for which the actual resonant frequency $f_a$ is nearest to but below the desired resonant frequency $f_d$;

(c) calculating the actual resonant frequency using $f_a=C_m(M,N)/2NG$ over at least a part of the range $1 \leq M < N/2$, where M is an integer and $C_m(M,N)$ accounts for changes in the material speed $C_m$ due to an effective electrode width $W_e=MG$ which is different from the electrode width W, and selecting the value of M for which a frequency error $f_e=f_d-f_a=f_d-C_m(M,N)/2NG$ is a minimum;

(d) fabricating the MEM resonator using the actual sub-width $L_a=NG$ and the effective electrode width $W_e=MG$ by:

providing a substrate having a plurality of layers deposited thereon, including a lower metallization layer, a piezoelectric layer and an upper metallization layer;

photolithographically patterning the upper metallization layer using the at least one photolithographic reticle having the grid size G, thereby forming an upper electrode in each of n actual sub-widths $L_a=NG$ where n is an integer, with each upper electrode having the effective electrode width $W_e=MG$;

photolithographically patterning the piezoelectric layer using the at least one photolithographic reticle having the grid size G, thereby defining an overall width $W_o=nL_a=nNG$ for the MEM resonator; and undercutting the MEM resonator with a selective etchant, thereby suspending the MEM resonator on the substrate;

decreasing the value of N by one;

repeating step (c), and selecting the value of M for which the frequency error $f_e$ is a minimum; and selecting whichever values of N and M provide the lowest frequency error $f_e$ for use in fabricating the MEM resonator in step (d).

7. The method of claim 6 further comprising the step of calculating an effective electrode length $L_e$ for the MEM resonator from $L_e=N\rho/MnR_d$ where $\rho$ is a resistivity per unit length of each upper electrode in the MEM resonator, and $R_d$ is a desired motional impedance for the MEM resonator, and with the effective electrode length $L_e$ being rounded to be an integer multiple of the grid size G.

8. The method of claim 7 wherein the step of photolithographically patterning the upper metallization layer using the at least one photolithographic reticle comprises photolithographically patterning the upper metallization layer to form each upper electrode with the effective electrode length $L_e$.

9. The method of claim 6 wherein the step of calculating parameters for the MEM resonator comprises calculating parameters for the MEM resonator with the piezoelectric layer comprising a piezoelectric material selected from the group consisting of aluminum nitride (AlN), lithium niobate (LiNbO$_3$), zinc oxide (ZnO), and lead-zirconate-titanate (PZT).

10. The method of claim 6 wherein the desired resonant frequency $f_d$ is in the range of 10 MHz to 10 GHz.

11. A method for fabricating a number j of microelectromechanical (MEM) resonators on a common substrate, comprising the steps of:

(a) calculating parameters for each MEM resonator for a desired resonant frequency $f_{di}$ for that MEM resonator with i=1, ..., j, including a sub-width $L_i=\lambda_i/2=C_{mi}/2f_{di}$ and an electrode width $W_i=\lambda_i/4=C_{mi}/4f_{di}$ for that MEM resonator where $\lambda_i$ is an acoustic wavelength and $C_{mi}$ is a material speed for that MEM resonator;

(b) calculating an actual resonant frequency $f_{ai}=C_{mi}/2L_{ai}=C_{mi}/2N_iG$ for which each MEM resonator can be fabricated using an actual sub-width $L_{ai}=N_iG$ for that MEM resonator where G is a grid size for at least one photolithographic reticle to be used to fabricate the number j of MEM resonators and NI; for each MEM resonator is calculated from $N_i=C_{mi}/2f_{di}G$ rounded to be an integer number for which the actual resonant frequency $f_{ai}$ is nearest to but above the desired resonant frequency $f_{di}$ for that MEM resonator;

(c) calculating the actual resonant frequency using $f_{ai}=C_{mi}(M_i,N_i)/2N_iG$ for each MEM resonator over at least a part of the range $N_i/2 \leq M_i < N_i$ where $M_i$ is an integer and $C_{mi}(M_i,N_i)$ accounts for changes in the material speed $C_{mi}$ due to an effective electrode width $W_{ei}=M_iG$ which is different from the electrode width $W_i$ for that MEM resonator, and selecting the value of $M_i$ for which a frequency error $f_{ei}=f_{di}-f_{ai}=f_{di}-C_{mi}(M_i,N_i)/2N_iG$ is a minimum for that MEM resonator;

(d) fabricating the number j of MEM resonators using the actual sub-widths $L_{ai}=N_iG$ and the effective electrode widths $W_{ei}=M_iG$ for $i=1, \ldots, j$ by:

providing a substrate having a plurality of layers deposited thereon, including a lower metallization layer, a piezoelectric layer and an upper metallization layer;

photolithographically patterning the upper metallization layer using the at least one photolithographic reticle having the grid size G, thereby forming $n_i$ upper electrodes in each of the j MEM resonators, with the $n_i$ upper electrodes in each MEM resonator having the effective electrode width $W_{ei}=M_iG$;

photolithographically patterning the piezoelectric layer using the at least one photolithographic reticle having the grid size G, thereby defining an overall width $W_{oi}=n_iL_{ai}=n_iN_iG$ for each MEM resonator where $i=1, \ldots j$; and undercutting the number j of MEM resonators with a selective etchant, thereby suspending each MEM resonator on the substrate;

increasing the values of $N_i$ by one;

repeating step (c), and selecting the values of $M_i$ for which the frequency error $f_{ei}$ is a minimum; and selectin whichever values of $N_i$ and $M_i$ provide the lowest frequency error $f_{ei}$ for each MEM resonator, and using these values of $N_i$ and $M_i$ in fabricating the number j of MEM resonators in step (d).

12. The method of claim 11 further comprising the step of calculating an effective electrode length $L_{ei}$ for each MEM resonator from $L_{ei}=N_i\rho/M_in_iR_d$ where $\rho$ is a resistivity per unit length of each upper electrode in the number j of MEM resonators, and $R_{di}$ is a desired motional impedance for each MEM resonator, and with the effective electrode length $L_{ei}$ for each MEM resonator being rounded to be an integer multiple of the grid size G.

13. The method of claim 12 wherein the step of photolithographically patterning the upper metallization layer using the at least one photolithographic reticle comprises photolithographically patterning the upper metallization layer to form the $n_i$ upper electrodes in each MEM resonator with the effective electrode length $L_{ei}$.

14. The method of claim 11 wherein the step of calculating parameters for each MEM resonator comprises calculating parameters for that MEM resonator with the piezoelectric layer comprising a piezoelectric material selected from the group consisting of aluminum nitride (AlN), lithium niobate (LiNbO$_3$), zinc oxide (ZnO), and lead-zirconate-titanate (PZT).

15. The method of claim 11 wherein the desired resonant frequency $f_{di}$ for each MEM resonator is in the range of 10 MHz to 10 GHz.

* * * * *